United States Patent [19]
Tada et al.

[11] Patent Number: 5,561,635
[45] Date of Patent: * Oct. 1, 1996

[54] PROM IC ENABLING A STRICTER MEMORY CELL MARGIN TEST

[75] Inventors: Yoshihiro Tada; Hiromi Uenoyama, both of Kyoto, Japan

[73] Assignee: Rohm Co., Ltd., Kyoto, Japan

[*] Notice: The portion of the term of this patent subsequent to Mar. 23, 2011, has been disclaimed.

[21] Appl. No.: 135,178

[22] Filed: Oct. 12, 1993

[30] Foreign Application Priority Data

Oct. 13, 1992 [JP] Japan .................................. 4-300502

[51] Int. Cl.⁶ ............................................. G11C 29/00
[52] U.S. Cl. ............... 365/201; 365/185.09; 365/189.11
[58] Field of Search ................................. 365/185, 201, 365/189.07, 189.11; 371/21.1, 21.2, 21.3

[56] References Cited

U.S. PATENT DOCUMENTS

| | | | |
|---|---|---|---|
| 4,612,630 | 9/1986 | Rosier | 365/201 |
| 4,779,272 | 10/1988 | Kohda et al. | 365/185 |
| 5,142,495 | 8/1992 | Canepa | 365/201 |

*Primary Examiner*—David C. Nelms
*Assistant Examiner*—Vu A. Le
*Attorney, Agent, or Firm*—Brumbaugh, Graves, Donohue & Raymond

[57] ABSTRACT

A sense circuit includes a sense amplifier and a pull-up resistor circuit disposed on the input side of the sense amplifier. In response to a test selection signal, a read voltage applying circuit applies an external voltage to a selected memory cell and the total resistance of the resistor circuit is switched from a normal resistance to a smaller resistance for testing. Since the input side of the sense amplifier is pulled up through the resistor circuit with the resistance for testing, it is possible to detect the storage state of the selected memory cell under a stricter condition.

3 Claims, 4 Drawing Sheets

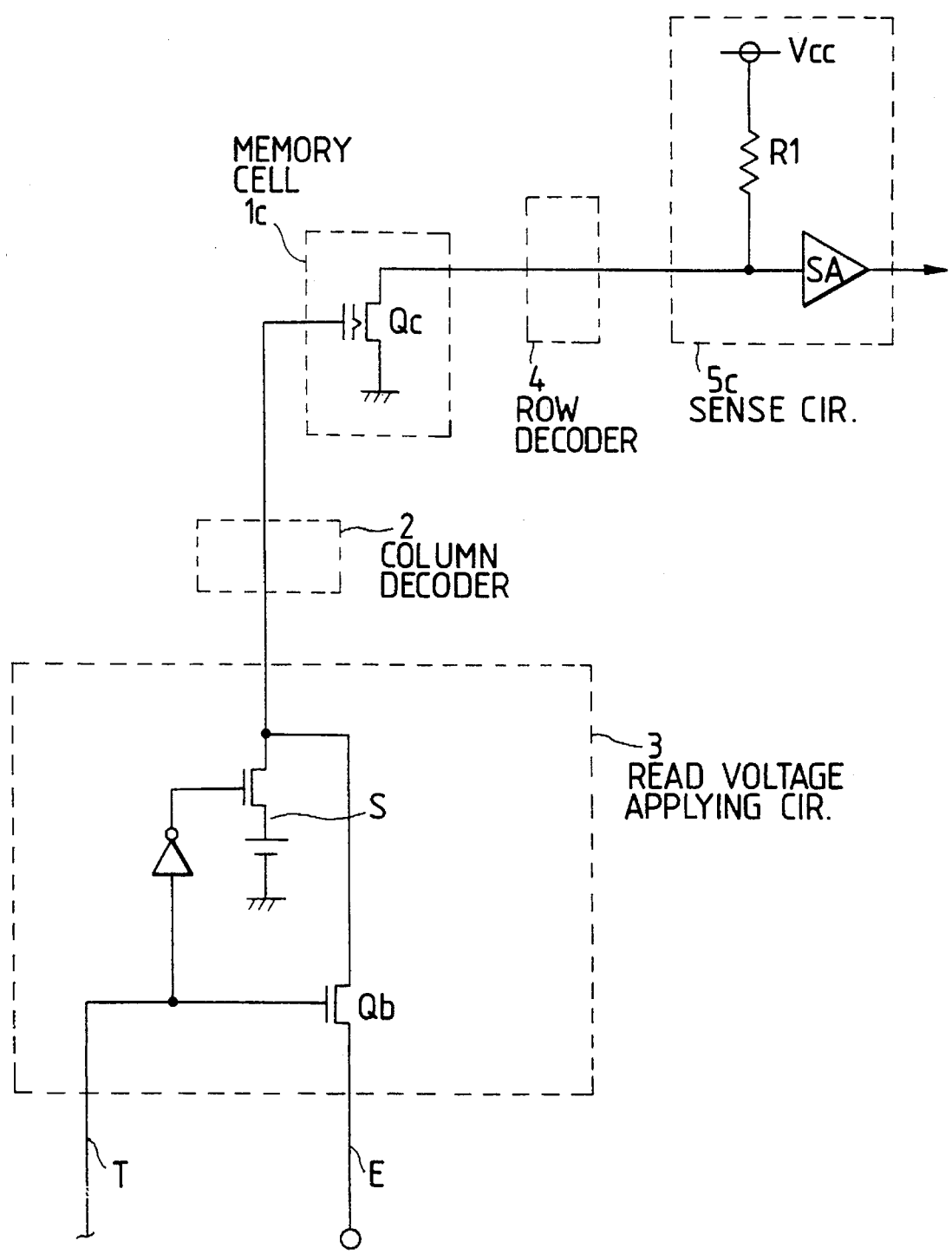

PROM IC ENABLING A STRICTER MEMORY CELL MARGIN TEST

BACKGROUND OF THE INVENTION

The present invention relates to PROM ICs. More specifically, the invention relates to EPROM ICs, EEPROM ICs, etc. of the type in which a margin test on storage states of respective memory cells can be performed under a stricter condition to enable selection of more reliable memory ICs.

Among nonvolatile memories are a mask ROM that is not rewritable and a PROM that is rewritable. The PROM is further classified into an EPROM that is erasable and rewritable and an EEPROM that electrically erasable and rewritable.

In teams of constitution, there are various types of PROMs. A fuse-type PROM, for instance, is rewritable only once. A FAMOS, for instance, can be erased with ultraviolet rays etc. and then data can be rewritten to it by avalanche breakdown. A MNOS, for instance, functions on the tunneling effect and is electrically erasable and rewritable. In a PROM IC, memory cells of one the above types are arranged in a matrix to constitute a memory array.

Referring to FIG. 3, we explain general constitution of the PROM IC.

Symbols $1a$, $1b$, . . . denote memory cells as mentioned above. As shogun in FIG. 3, the memory cells $1a$, $1b$, . . . are arranged in a matrix to constitute a memory array 1.

Numerals 2 and 4 denote a column decoder and a row decoder, respectively. In response to an address signal A (character A also represents an address itself), the column decoder 2 selects a column and the row decoder 4 selects a row, to thereby select a memory cell corresponding to the address A among the memory cells $1a$, $1b$, . . . arranged in a matrix.

Symbols $5a$, $5b$, . . . denote sense circuits. When a read voltage is supplied from a read voltage applying circuit 3 to the memory cell (selected memory cell) corresponding to the address A that is selected by the decoders 2 and 4 and information is read out from that memory cell, a resulting readout signal is amplified by a sense amplifier of one of the sense circuits $5a$, $5b$, . . . When a read voltage that is larger than a predetermined threshold level is applied to the memory cell, the corresponding sense amplifier produces an inverted output. Thus, Each of the sense circuits $5a$, $5b$, . . . produces a binary output.

When receiving a test selection signal T, the read voltage applying circuit 3 switches the read voltage, which is to be applied to the selected memory cell through the column decoder 2, from a standard read voltage S to an external voltage E.

Referring to FIG. 4, we explain a relationship among the read voltage applying circuit 3, a selected memory cell $1c$ and a corresponding sense circuit $5c$ (having a sense amplifier SA). The test selection signal T is generated in response to a signal that is externally set to select a test mode.

FIG. 4 shows a state in which the memory cell $1c$ is selected in the PROM IC of FIG. 3. To provide a clear description, FIG. 4 is simplified such that the memory cells other than the memory cell $1c$ are omitted and each of the column decoder 2 and the row decoder 3 is drawn simply as a connection line by omitting a transistor for conduction control and other parts. In this example, since the memory cell $1c$ is constituted of a floating gate type transistor Qc, the read voltage is applied to the gate of the transistor Qc through the column decoder 2.

In the absence of the test selection signal T, that is, in the normal read operation, in which case a transistor Qb is in an off-state, the preset standard read voltage S is supplied, as the read voltage, from the read voltage applying circuit 3 to the gate of the transistor Qc. On the other hand, in the presence of the test signal T, that is, in a performance test such as what is called a margin test, the external voltage E is input, as the read voltage, through a test-dedicated terminal or some other external terminal of the PROM IC, and is then output from the read voltage applying circuit 3 so as to be used to read out the stored information. In this case, the external voltage E is applied to the gate of the transistor Qc of the selected memory cell $1c$ through the transistor Qb that is in an on-state. In the test operation, the sense circuit $5c$, which is connected to the drain of the transistor Qc through the row decoder 4, detects the storage state of the memory cell $1c$, i.e., the trap state of electrons or holes in the floating gate of the transistor Qc. This is done by detecting the current drive ability of the transistor Qc when the read voltage is applied to the gate of it.

This is explained more specifically below. The input side of the sense amplifier SA of the sense circuit $5c$ is connected to the drain of the transistor Qc and pulled up to a voltage supply Vcc through a resistor R1 (usually several hundreds of kilo-ohms to several mega-ohms). Therefore, when the read voltage is applied to the gate of the transistor Qc stored with information, a read current flows from the voltage supply Vcc into the transistor Qc in accordance with the read voltage. In response, a voltage drop occurring in the resistor R1 in accordance with the above current is detected by the sense amplifier SA as the readout signal. The sense amplifier SA produces the inverted or noninverted voltage in accordance with the voltage of the readout signal. Thus, the binary signal is output from the IC.

On the other hand, in the floating gate type transistor, the on/off threshold voltage of the transistor is determined by how much charge of electrons or holes is accumulated in the floating gate. If the readout voltage is higher than the threshold voltage, the transistor is turned on. If the readout voltage is lower than the threshold voltage, the transistor is turned off. Therefore, the output state corresponding to the regular value stored in the memory cell $1c$ can be determined for the read voltage applied to the gate of the transistor Qc; that is, the storage state of the memory cell $1c$ can be detected.

To test the degree of storage state of the selected memory cell $1c$, that is, the trap degree of electrons or holes in the floating gate of the transistor Qc, in the test operation the external voltage E, which provides a stricter condition than the standard read voltage S (usually, the former is lower than the latter), is applied to the memory cell $1c$ as the read voltage. The degree of storage state of the selected memory cell $1c$ is detected based on the resulting binary output.

As described above, the margin test for the actual read operation can be performed by reading out the information stored in the memory cell under a condition stricter than the normal condition. This enables supply of selected PROM IC products having stable performance.

However, there exist certain types of memory cells which do not allow proper application of the above margin test. An example is a margin test in which the above-mentioned floating gate type transistor is in a depletion state as a result of trapping of holes or release of electrons in the floating gate. To perform a proper margin test on a memory cell whose transistor is in a depletion state, the externally supplied read voltage E should be a negative voltage (about −4

V if possible). However, the performance test cannot be satisfactory with the externally supplied, negative read voltage of about −4 V, because in the above-mentioned floating gate type transistor memory short-circuiting to the grounding terminal occurs in a path leading from the terminal for the external voltage E to the transistor of the selected memory cell due to a parasitic diode existing in a part of the path.

Therefore, conventionally, there is no satisfactory method of conducting the above-described margin test except for the case where the test is performed on a PROM IC in a wafer state having only a circuit dedicated to the margin test or an invasive test or the like is performed on a PROM IC not to become a final product. At present, the margin test on mass-production PROM IC products is performed with the external voltage E of about 0 V in the lowest voltage case, so that the reliability of PROM ICs is not necessarily sufficient.

SUMMARY OF THE INVENTION

An object of the present invention is to enable a performance test on a PROM IC under a condition stricter than the conventional condition, to thereby provide highly reliable PROM IC products that are compatible with the conventional products.

Another object of the invention is to enable a margin test on a packaged PROM IC product, to thereby provide highly reliable products through selection.

According to the invention, a PROM IC comprises:

a read voltage applying circuit for switching from a preset read voltage to an external read voltage in response to a test selection signal, a plurality of memory cells, means for selecting one of the memory cells in accordance with an address signal and for applying the external read voltage to the selected memory cell, and a sense circuit for detecting a readout signal that is output from the selected memory cell in response to the external read voltage to produce a binary output signal to be used for judgment of storage performance of the selected memory cell, wherein said sense circuit comprises, on its readout signal input side, a pull-up resistor circuit having a total resistance which changes in response to the test selection signal so as to provide a stricter condition for a current drive ability of the selected memory cell.

In testing the storage state of the selected memory cell of the PROM IC having the above constitution, the resistance of the pull-up resistor circuit provides a stricter condition for the drive current ability, i.e., a stricter test condition for the selected memory cell. It becomes possible to conduct a performance test such as a margin test under a stricter condition. As a result, the selected memory cell having the storage state capable of producing a normal output value even in the above test should have a margin larger than in the conventional tests. This enables selection of only the reliable PROM ICs.

Further, since the above IC does not need any new external terminals, it can maintain complete compatibility in terms of conditions in use with conventional ICs. In addition, since a packaged IC, i.e., an IC product can be subjected to the test under a condition stricter than in the conventional tests, more reliable PROM ICs can be produced on a mass-production basis.

BRIEF DESCRIPTION OF THE DRAWINGS

FIG. 4 is a block diagram showing a conventional PROM IC with an emphasis on a portion related to a subject memory cell in a test operation.

DESCRIPTION OF THE PREFERRED EMBODIMENTS

Figure 1:
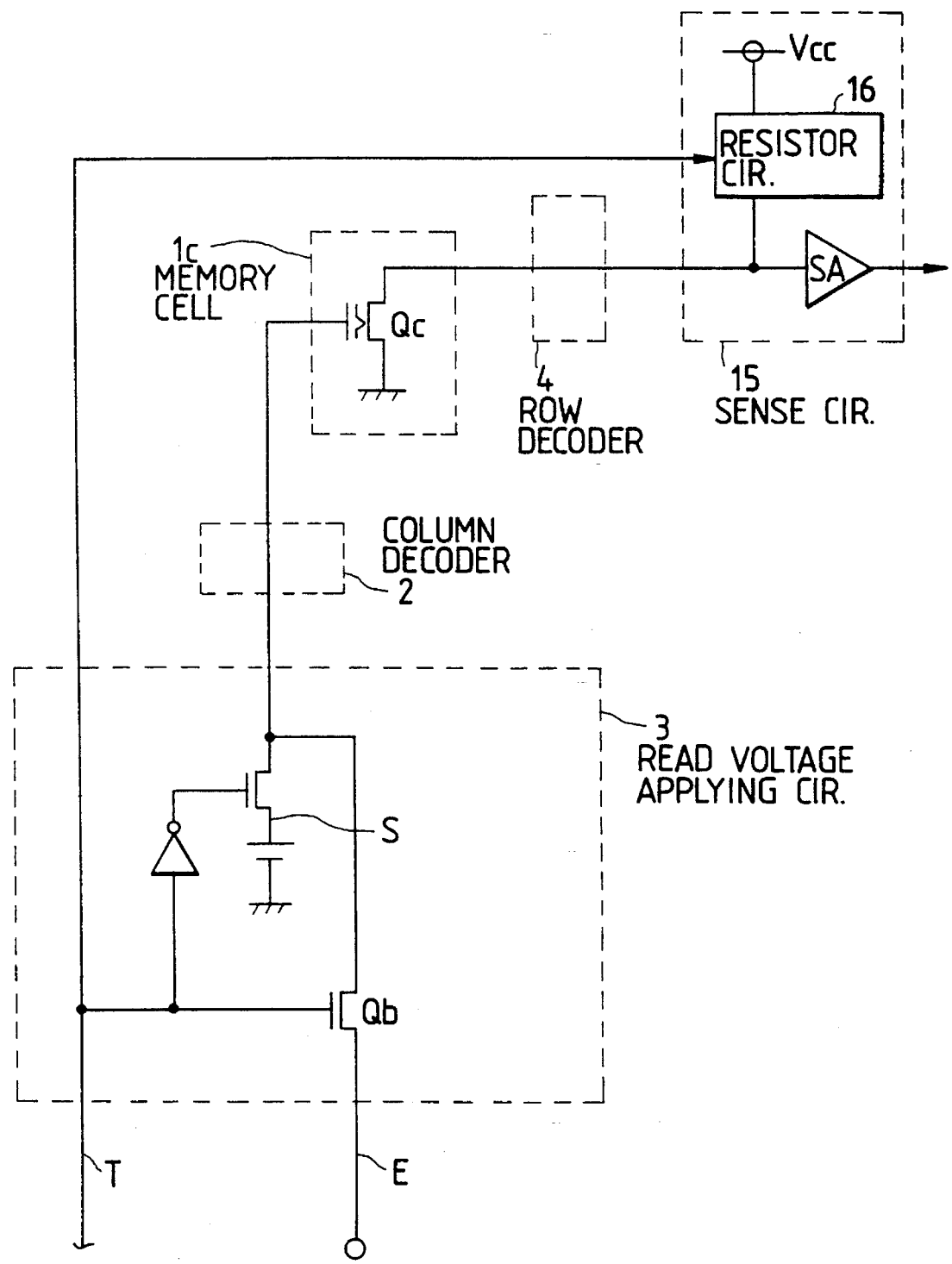
FIG. 1 is a block diagram showing a PROM IC according to an embodiment of the present invention with an emphasis on a portion related to a subject memory cell in a test operation.

A circuit of FIG. 1 according to an embodiment of the present invention is different from the corresponding circuit of FIG. 4 only in that the sense circuit 5c of FIG. 4 is replaced with a sense circuit 15. The parts in FIGS. 1 and 2 that are the same as in FIGS. 3 and 4 are denoted by the same reference symbols, and descriptions therefor are omitted here.

The sense circuit 15 includes a resistor circuit 16 that receives the test selection signal T, instead of the conventional pull-up resistor R1 of several hundreds of kilo-ohms to several mega-ohms. Connected between the voltage supply Vcc and the input side of the sense amplifier SA, the resistor circuit 16 pulls up the input-side of the sense amplifier SA to the voltage supply Vcc. In the normal state, i.e., in the absence of the test selection signal T, the resistor circuit 16 exhibits the same resistance as the conventional resistor R1 of FIG. 4, i.e., several hundreds of kilo-ohms to several mega-ohms. On the other hand, in the presence of the test selection signal T, the resistor circuit 16 exhibits a resistance much smaller than R1, for instance, several kilo-ohms to several tens of kilo-ohms.

During the test operation, when the external voltage E for the test is applied to the gate of the transistor Qc of the selected memory cell 1c through the read voltage applying circuit 3, a drive current larger than that of the normal operation flows from the voltage supply Vcc to the drain of the transistor Qc through the resistor circuit 16 having the smaller resistance. If the drive current is at the same level as in the normal operation, the detection of the readout information by the sense amplifier SA becomes more difficult because the smaller resistance of the resistor circuit 16 causes a smaller voltage drop therein.

The information writing to the memory cell transistor having the floating gate is effected by charging the floating gate with electrons or holes, and deterioration of the storage performance is caused by release of the charge from the floating gate. When information has been written into the memory cell that was in an erasure state, positive charge is accumulated in the floating gate to provide a threshold voltage of about −2 V. And in the occurrence of charge release, the threshold voltage increases to 0 V or the positive side. If the read voltage is close to the threshold value, the transistor comes to operate in the saturation region, so that the on-resistance of the transistor increases to lower its current drive ability. Therefore, the conventional margin test is performed with the read voltage of 0 V. However, this type of margin test can detect only the defective, low-current-drive-ability memory cells having threshold voltages of negative values close to 0 V. On the other hand, the margin test of the invention, which is performed with the smaller pull-up resistance (smaller by more than one order) and the read voltage of 0 V, can detect defective, low-current-drive-ability memory cells having smaller threshold values of, for instance, −0.5 V or less. This will improve the reliability of PROM ICs in the case where the margin test is performed with the read voltage of 0 V.

FIGS. 2(a)–2(d) show specific examples of the resistor circuit 16 for switching between resistances R1 and R2 or between R1 and a parallel connection of R1 and R3. The symbols of resistors also indicate their resistances.

Figure 2A:
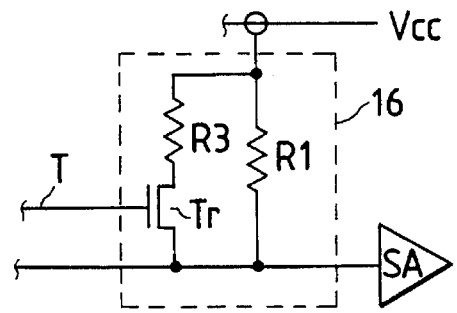
FIGS. 2(a)–2(d) show specific examples of pull-up resistor circuits which can be used in the PROM IC of FIG. 1.
Figure 2B:
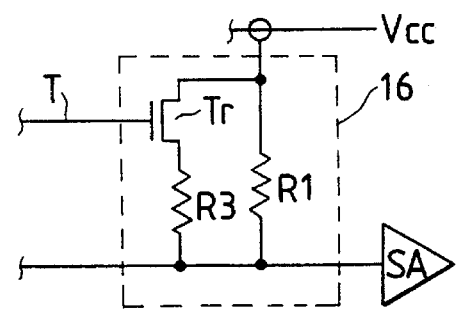
Figure 3:
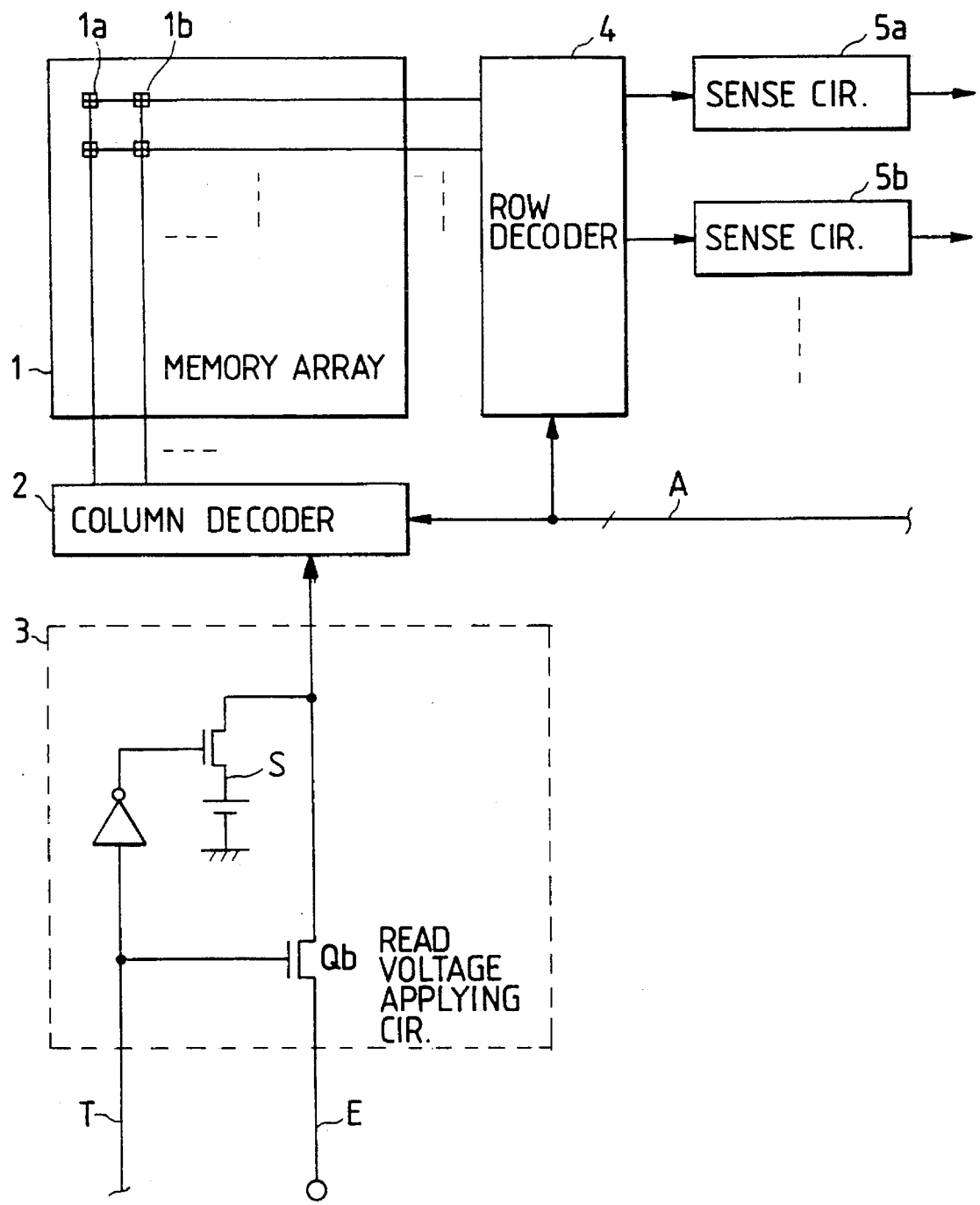
FIG. 3 is a block diagram showing general constitution of a PROM IC including a test circuit.

In both examples of FIGS. 2(a) and 2(b), the resistor R3 is in parallel with the resistor R1. The only difference between these examples is the connection order of the resistor R3 and a transistor Tr which receives the test selection signal T at its gate. In either resistor circuit 16, its total resistance is equal to R1 in the absence of the test selection signal T (the transistor Tr is cut off), and is equal to a parallel resistance of R1 and R3 in the presence of the signal T (the transistor Tr is conductive).

Figure 2C:
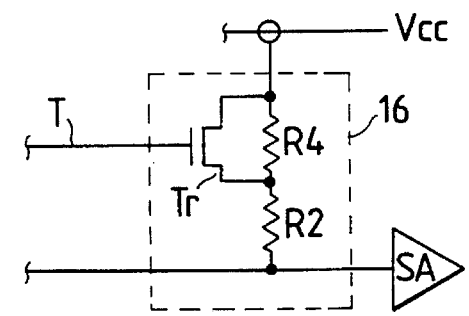
Figure 2D:
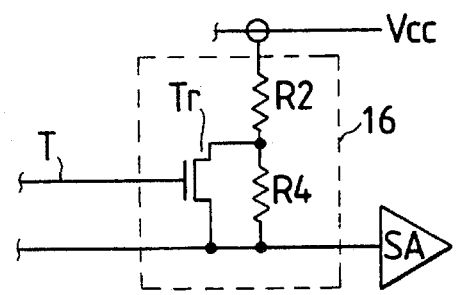

In both examples of FIGS. 2(c) and 2(d), the resistors R2 and R4 (R4=R1−R2) are in series connection, and a transistor Tr which receives the test selection signal T at its gate is in parallel with the resistor R4. The only difference between these examples is the connection order of the resistors R2 and R4. In either resistor circuit 16, its total resistance is R2 +R4, i.e., R1 in the absence of the test selection signal T (the transistor Tr is cut off), and is R2 in the presence of the signal T (the transistor Tr is conductive).

Apparently the above examples are typical ones, and the constitution of the resistor circuit 16, which switches resistances in response to the test selection signal T, is not limited to those examples. For example, if the channel length of the transistor Tr is increased so that its on-resistance (conduction resistance) becomes equal to R3 or R4, the transistor Tr itself can be used as a resistor to remove R3 or R4. The resistor circuit 16 may be constituted of the transistor Tr and the resistor R1, or of an on/off transistor, the transistor Tr to be substituted for the resistor R4, and the resistor R2. Further, all the resistors may be constituted of transistors.

According to the PROM IC having the above constitution, the test circuit can be effectively utilized even after the packaging. That is, not only the evaluation during the manufacturing process and the testing before the shipment can be performed under a stricter condition by setting the external voltage E in accordance with the content of a test, but also the read verifying etc. during actual use as an IC can be performed under a stricter condition by proper internal processing (such as processing based on a program) in a device.

Although in the above embodiment the read voltage of the margin test is set at 0 V, it is not limited to 0 V in the invention. Further, the invention is not limited to the case where the performance test is effected with the reduced pull-up resistance, but it suffices that the pull-up resistance is switched, in accordance with the content of a test, to such a value as provides a stricter condition to check the current drive ability of memory cells.

As is understood from the above description, in the PROM IC according to the invention having the pull-up resistor circuit in the sense circuit, the margin test of a packaged IC product can be performed under a condition stricter than in the conventional tests. As a result, the invention can contribute to mass-production of highly reliable PROM ICs.

What is claimed is:

1. A PROM IC comprising:

a read voltage applying circuit for switching from a preset read voltage to an external read voltage in response to a test selection signal, a plurality of memory cells, means for selecting one of the memory cells in accordance with an address signal and for applying the external read voltage to the selected memory cell, means for applying the test selection signal to cause the external read voltage to be applied to the selected memory cell in place of the preset read voltage, and a sense circuit for detecting a readout signal that is output from the selected memory cell in response to the external read voltage to produce a binary output signal to be used for judgment of storage performance of the selected memory cell, wherein said sense circuit comprises, on its readout signal input side, a pull-up resistor circuit having a total resistance which changes in response to application of the test selection signal to the read voltage applying circuit so as to provide a stricter condition for a current drive ability of the selected memory cell.

2. The PROM IC of claim 1, wherein each of the memory cells comprises a floating gate type transistor, and the preset read voltage or the external read voltage is applied to a gate of the floating gate type transistor.

3. The PROM IC of claim 1, wherein the total resistance of the resistor circuit decreases in response to the test selection signal.

\* \* \* \* \*